(12) United States Patent
Hung et al.

(10) Patent No.: US 11,290,100 B2
(45) Date of Patent: Mar. 29, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Hung Hung, Kawasaki Kanagawa (JP); Yasuhiro Isobe, Ota Tokyo (JP); Akira Yoshioka, Yokohama Kanagawa (JP); Toru Sugiyama, Musashino Tokyo (JP); Masaaki Iwai, Yokohama Kanagawa (JP); Naonori Hosokawa, Yokohama Kanagawa (JP); Masaaki Onomura, Setagaya Tokyo (JP); Hitoshi Kobayashi, Yamato Kanagawa (JP); Tetsuya Ohno, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/012,386

(22) Filed: Sep. 4, 2020

(65) Prior Publication Data
US 2021/0194475 A1 Jun. 24, 2021

(30) Foreign Application Priority Data
Dec. 19, 2019 (JP) .............................. JP2019-229760

(51) Int. Cl.
*H03K 17/041* (2006.01)
*H03K 17/74* (2006.01)
*H03K 17/0412* (2006.01)

(52) U.S. Cl.
CPC . *H03K 17/04106* (2013.01); *H03K 17/04123* (2013.01); *H03K 17/74* (2013.01)

(58) Field of Classification Search
CPC ............ H03K 17/00; H03K 17/04106; H03K 17/04123; H03K 17/04126;
(Continued)

(56) References Cited

U.S. PATENT DOCUMENTS 9,490,800 B2   11/2016  Kimura
2015/0236635 A1  8/2015  Goto
(Continued)

FOREIGN PATENT DOCUMENTS

JP    2015-154594 A    8/2015
JP    6229604 B2    11/2017
(Continued)

*Primary Examiner* — Diana J. Cheng
*Assistant Examiner* — Dave Mattison
(74) *Attorney, Agent, or Firm* — Allen & Overy LLP (57) ABSTRACT

Provided is a semiconductor device including a normally-off transistor having a first electrode, a second electrode, and a first control electrode, a normally-on transistor having a third electrode, a fourth electrode, and a second control electrode, a first capacitor having a first end and a second end, a Zener diode having a first anode and a first cathode, a first resistor having a third end and a fourth end, a first diode having a second anode and a second cathode, a second resistor having a fifth end and a sixth end, a second diode having a third anode and a third cathode, and a second capacitor having a seventh end and an eighth end.

21 Claims, 8 Drawing Sheets

(58) Field of Classification Search
CPC ........... H03K 17/04213; H03K 17/063; H03K 17/567; H03K 17/74
USPC ........................................................ 327/374
See application file for complete search history.

(56) References Cited

U.S. PATENT DOCUMENTS

2018/0013415 A1* 1/2018 Ikeda ..................... H03K 17/74
2021/0083577 A1* 3/2021 Yoshioka ............. H03K 17/102

FOREIGN PATENT DOCUMENTS

| JP | 2018-033303 A | 3/2018 |
| JP | 6392458 B2 | 9/2018 |

* cited by examiner

SEMICONDUCTOR DEVICE

CROSS-REFERENCE TO RELATED APPLICATION

This application is based upon and claims the benefit of priority from Japanese Patent Application No. 2019-229760, filed on Dec. 19, 2019, the entire contents of which are incorporated herein by reference.

FIELD

Embodiments described herein relate generally to semiconductor devices.

BACKGROUND

Group III nitrides, for example, gallium nitride (GaN) based semiconductors are expected as materials for next-generation power semiconductor devices. The GaN based semiconductors have a large bandgap as compared with silicon (Si). For this reason, the GaN based semiconductor device can realize a small-sized, high-breakdown-voltage power semiconductor device as compared with a silicon (Si) semiconductor device. In addition, this can reduce the parasitic capacitance, so that a power semiconductor device driven at a high speed can be realized.

For the GaN based transistors, a high electron mobility transistor (HEMT) structure that uses a two-dimensional electron gas (2DEG) as a carrier is generally employed. A typical HEMT is a normally-on transistor. That is, the HEMT is allowed to conduct without applying a voltage to the gate. For this reason, there is a problem that it is difficult to realize a normally-off transistor that does not conduct unless a voltage is applied to the gate.

In power source circuits or the like that treat large electric power of several hundreds to 1,000 V normally-off operation is required with an emphasis on safety. Therefore, a circuit configuration has been proposed in which a normally-on GaN based transistor and a normally-off Si transistor are connected to realize the normally-off operation.

DETAILED DESCRIPTION

A semiconductor device according to an embodiment includes: a normally-off transistor having a first electrode, a second electrode, and a first control electrode; a normally-on transistor having a third electrode electrically connected to the second electrode, a fourth electrode, and a second control electrode; a first capacitor having a first end and a second end electrically connected to the second control electrode; a Zener diode having a first anode and a first cathode, the first anode being electrically connected to the second end and the second control electrode, and the first cathode being electrically connected to the third electrode; a first resistor having a third end and a fourth end electrically connected to the first control electrode; a first diode having a second anode and a second cathode, the second anode being electrically connected to the third end; a second resistor having a fifth end electrically connected to the second cathode and a sixth end electrically connected to the fourth end and the first control electrode; a second diode having a third anode and a third cathode, the third anode being electrically connected to the second end, the first anode, and the second control electrode, and the third cathode being electrically connected to the first electrode; and a second capacitor having a seventh end and an eighth end, the seventh end being electrically connected to the fourth end, the sixth end, and the first control electrode, and the eighth end being electrically connected to the first electrode.

Hereinafter, embodiments will be described with reference to the drawings. In addition, in the following description, the same or similar members may be denoted by the same reference numerals. In addition, description of the members and the like once described may be appropriately omitted.

In addition, in this specification, the semiconductor device is a concept including power module in which a plurality of elements such as discrete semiconductors are combined, an intelligent power module in which a drive circuit for driving these elements and a self-protection function is combined into a plurality of elements such as discrete semiconductors, or an entire system equipped with the power module or the intelligent power module.

In addition, in this specification, "GaN based semiconductor" is a collective term for semiconductors having gallium nitride (GaN), aluminum nitride (AlN), indium nitride (InN), and intermediate compositions thereof.

EMBODIMENT

A semiconductor device according to an embodiment includes a normally-off transistor having a first electrode, a second electrode, and a first control electrode; a normally-on transistor having a third electrode electrically connected to the second electrode, a fourth electrode, and a second control electrode; a first capacitor having a first end and a second end electrically connected to the second control electrode; a Zener diode having a first anode and a first cathode, the first anode being electrically connected to the second end and the second control electrode, and the first cathode being electrically connected to the third electrode; a first resistor having a third end and a fourth end electrically connected to the first control electrode; a first diode having a second anode and a second cathode, the second anode being electrically connected to the third end; a second resistor having a fifth end electrically connected to the second cathode and a sixth end electrically connected to the fourth end and the first control electrode; a second diode having a third anode and a third cathode, the third anode being electrically connected to the second end, the first anode, and the second control electrode, and the third cathode being electrically connected to the first electrode; and a second capacitor having a seventh end and an eighth end, the seventh end being electrically connected to the fourth end, the sixth end, and the first control electrode, and the eighth end being electrically connected to the first electrode.

Figure 1:
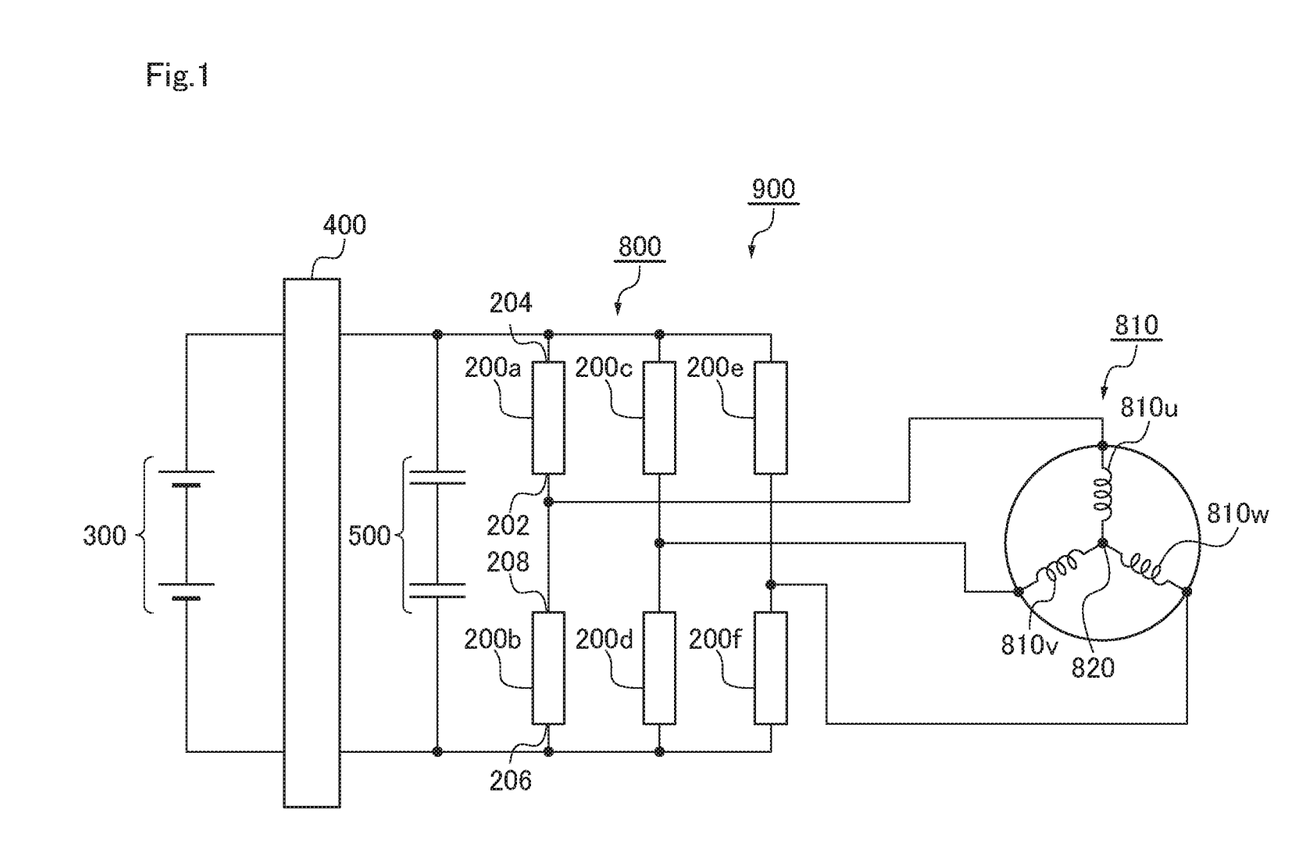
FIG. 1 is a schematic diagram of a power conversion system according to an embodiment.

FIG. 1 is a schematic diagram of a power conversion system 900 according to the embodiment.

The power conversion system 900 includes a power conversion device 800 and a motor 810.

The power conversion device 800 includes transistors 200a 200b, 200c, 200d, 200e, and 200f, a DC power source 300, a converter 400, and a smoothing capacitor 500. In addition, the transistors 200a, 200b, 200c, 200d, 200e, and 200f may include a plurality of transistors, other elements, and the like as described later.

The DC power source 300 outputs a DC voltage. The converter 400 is a DC-DC converter and converts the DC voltage output from the DC power source 300 into another DC voltage. The smoothing capacitor 500 smoothes the voltage output by the converter 400.

Each of the transistors 200a, 200b, 200c, 200d, 200e, and 200f has a semiconductor device 100 described later. The DC voltage smoothed by the smoothing capacitor 500 is converted into an AC voltage by the transistors 200a, 200b, 200c, 200d, 200e and 200f.

For example, the transistor 200a has a first transistor electrode 202 and a second transistor electrode 204. In addition, the transistor 200b has a third transistor electrode 206 and a fourth transistor electrode 208. The transistor 200a and the transistor 200b are electrically connected to each other by electrically connecting the first transistor electrode 202 and the fourth transistor electrode 208.

Similarly, the transistor 200c and the transistor 200d are electrically connected to each other, and the transistor 200e and the transistor 200f are electrically connected to each other.

The motor 810 has coils 810u, 810v, and 810w. One ends of the coils 810u, 810w, and 810v are electrically connected to each other at a neutral point 820. The other end of the coil 810u is electrically connected between the transistor 200a and the transistor 200b. The other end of the coil 810v is electrically connected between the transistor 200c and the transistor 200d. The other end of the coil 810w is electrically connected between the transistor 200e and the transistor 200f.

In addition, the ground in the power conversion device 800 according to the embodiment may be electrically connected, for example, between the plurality of smoothing capacitors 500 provided. In addition, for example, the ground in the power conversion device 800 may be electrically connected to electric wires to which the transistor 200b, the transistor 200d, and the transistor 200f are electrically connected to each other.

Figure 2:
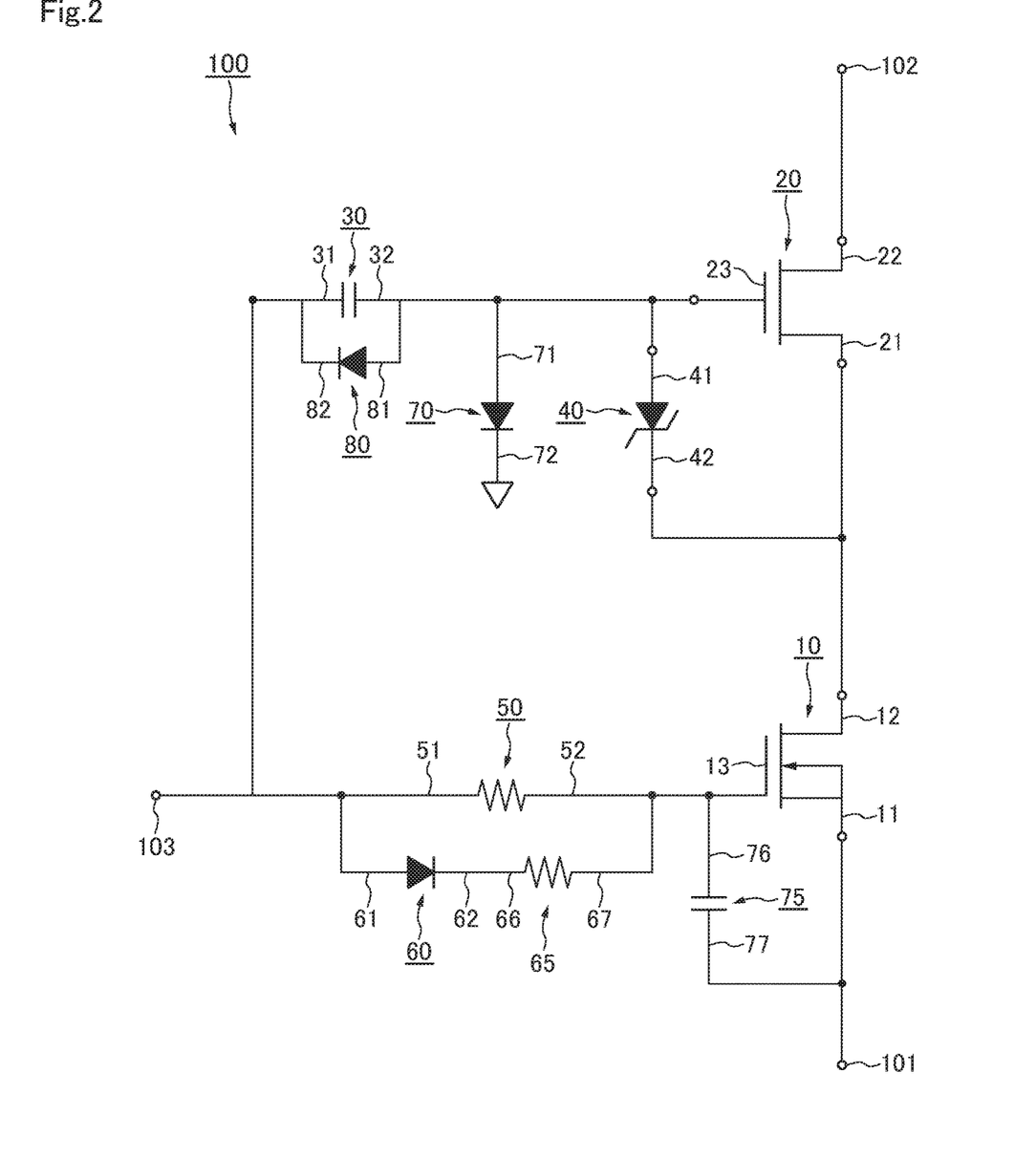
FIG. 2 is a circuit diagram of a semiconductor device according to an embodiment.

FIG. 2 is a circuit diagram of the semiconductor device 100 according to the embodiment. The semiconductor device 100 according to the embodiment is a power module having a rated voltage of, for example, 600 V or 1200 V.

The semiconductor device 100 includes a normally-off transistor 10, a normally-on transistor 20, a first capacitor 30, a Zener diode 40, a first resistor 50, a first diode 60, a second resistor 65, a second diode 70, a second capacitor 75, a third diode 80, a first terminal 101, a second terminal 102, and a third terminal 103.

The normally-off transistor 10 has a first electrode 11, a second electrode 12, and a first control electrode 13.

The normally-off transistor 10 is a transistor in which a drain current does not flow in a case where an input voltage of the gate is not greater than the threshold voltage. The normally-off transistor 10 is an n-type metal oxide semiconductor field effect transistor (MOSFET) using, for example, a silicon (Si) semiconductor. For example, the first electrode 11 is a source electrode, the second electrode 12 is a drain electrode, and the first control electrode 13 is a gate electrode. However, the normally-off transistor 10 is not limited to this transistor. For example, the normally-off transistor 10 may be a p-type MOSFET.

The normally-off transistor 10 has a breakdown voltage of, for example, 10 V or more and 30 V or less.

The normally-on transistor 20 has a third electrode 21, a fourth electrode 22, and a second control electrode 23. The third electrode 21 is electrically connected to the second electrode 12.

The normally-on transistor 20 is a transistor where the drain current flows even in a case where no voltage is input to the gate. The normally-on transistor 20 is, for example, an HEMT using a GaN based semiconductor. For example, the third electrode 21 is a source electrode, the fourth electrode 22 is a drain electrode, and the second control electrode 23 is a gate electrode.

The breakdown voltage of the normally-on transistor 20 is higher than the breakdown voltage of the normally-off transistor 10. The normally-on transistor 20 has a breakdown voltage of, for example, 600 V or more and 1200 V or less.

The first capacitor 30 has a first end 31 and a second end 32. The second end 32 is electrically connected to the second control electrode 23.

The electrostatic capacitance $C_1$ of the first capacitor 30 is preferably 10 times or more the input capacitance of the normally-on transistor 20.

The Zener diode 40 has a first anode 41 and a first cathode 42. The first anode 41 is electrically connected to the second end 32 and the second control electrode 23. The first cathode 42 is electrically connected to the third electrode 21 and the second electrode 12.

The Zener voltage Vz of the Zener diode 40 is preferably lower than the breakdown voltage of the normally-on transistor 20 between the second control electrode 23 and the third electrode 21.

The first resistor 50 has a third end 51 and a fourth end 52. The third end 51 is electrically connected to the first end 31. The fourth end 52 is electrically connected to the first control electrode 13.

The first resistor 50 is an electric resistance, a resistance element, or an electric resistance element.

The first diode 60 has a second anode 61 and a second cathode 62. The second anode 61 is electrically connected to the first end 31 and the third end 51.

The second resistor 65 has a fifth end 66 and a sixth end 67. The fifth end 66 is electrically connected to the second cathode 62. The sixth end 67 is electrically connected to the fourth end 52 and the first control electrode 13.

The element in which the first diode 60 and the second resistor 65 are connected in series is connected in parallel to the first resistor 50.

The second resistor 65 is an electric resistance, a resistance element, or an electric resistance element.

The second diode 70 has a third anode 71 and a third cathode 72. The third anode 71 is electrically connected to the second end 32, the first anode 41, and the second control electrode 23. The third cathode 72 is electrically connected to the first electrode 11.

The second capacitor 75 has a seventh end 76 and an eighth end 77. The seventh end 76 is electrically connected to the fourth end 52, the sixth end 67, and the first control electrode 13. The eighth end 77 is electrically connected to the first electrode 11.

When the electrostatic capacitance of the second capacitor 75 is denoted by $C_2$, the gate-source capacitance of the normally-off transistor 10 is denoted by $C_{gs}$, and the gate-drain capacitance of the normally-off transistor 10 is denoted by $C_{gd}$.

$$C_2 > C_{gs} + C_{gd} \qquad \text{[Mathematical Formula 1]}$$

it is preferable that Mathematical Formula 1 is satisfied.

The third diode 80 has a fourth anode 81 and a fourth cathode 82. The fourth anode 81 is electrically connected to the second end 32, the third anode 71, the first anode 41, and the second control electrode 23. The fourth cathode 82 is connected to the first end 31, the third end 51 and the second anode 61.

The first terminal 101 is electrically connected to the first electrode 11 and the eighth end 77. The second terminal 102 is electrically connected to the fourth electrode 22. The third terminal 103 is electrically connected to the first end 31, the fourth cathode 82, the third end 51, and the second anode 61. The first terminal 101, the second terminal 102, and the third terminal 103 are terminals for connecting the semiconductor device 100 to other electric circuits or the like.

The first diode 60, the second diode 70, and the third diode 80 are preferably Schottky barrier diodes. This is because the response speed is high. In addition, the first diode 60, the second diode 70, and the third diode 80 may be, for example, PN junction diodes.

The first capacitor 30 and the second capacitor 75 are preferably ceramic capacitors. This is because the ceramic capacitor has excellent frequency characteristics. However, the first capacitor 30 and the second capacitor 75 may be other film capacitors, aluminum electrolytic capacitors, tantalum electrolytic capacitors, or the like.

The semiconductor device 100 according to the embodiment realizes a normally-off operation by electrically connecting the normally-off transistor 10 and the normally-on transistor 20 in series.

For example, in a case where the semiconductor device 100 is used for the transistor 200b (FIG. 1), the third transistor electrode 206 is electrically connected to the first electrode 11 and the eighth end 77 via the first terminal 101, and the fourth transistor electrode 208 is electrically connected to the fourth electrode 22 via the second terminal 102.

Figure 3:
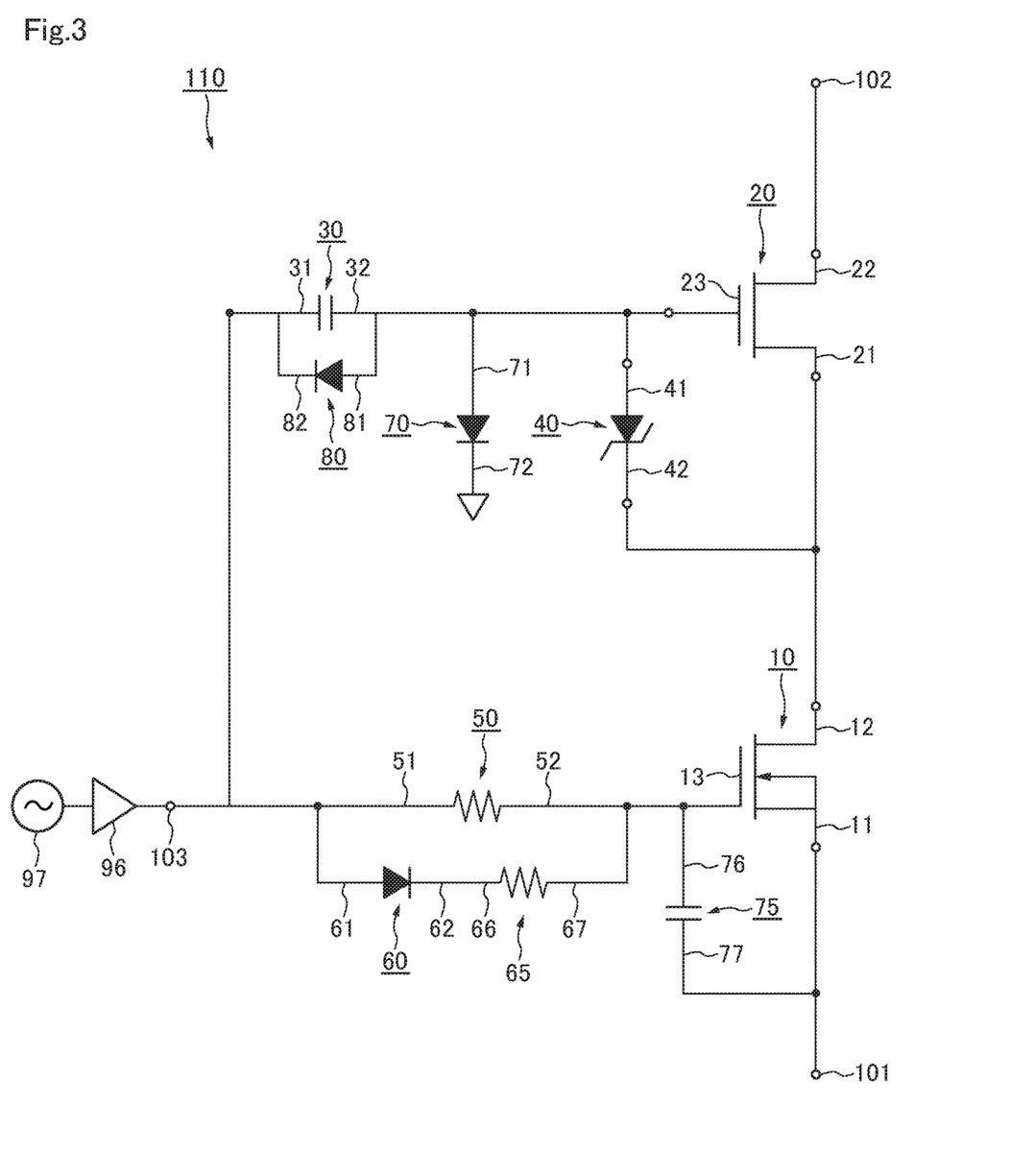
FIG. 3 is a circuit diagram of a semiconductor device according to a first other aspect of the embodiment.

FIG. 3 is a circuit diagram of the semiconductor device 110 according to the first other aspect of the embodiment.

A signal source 97 outputs a signal such as a square wave or a rectangular wave.

A gate drive circuit 96 is electrically connected to the signal source 97 and the third terminal 103. Then, the gate drive circuit 96 is electrically connected to the first end 31, the third end 51, the second anode 61, and the fourth cathode 82 via the third terminal 103. The gate drive circuit 96 outputs a signal for driving the normally-off transistor 10 and the normally-on transistor 20 on the basis of the signal output from the signal source 97.

The gate drive circuit 96 is, for example, an electronic circuit. The gate drive circuit 96 is, for example, a computer configured with a combination of hardware such as an arithmetic circuit and software such as a program. The gate drive circuit 96 is an IC in which a plurality of elements are integrated into a single chip or an electronic circuit board on which a plurality of electronic components are disposed.

Figure 4:
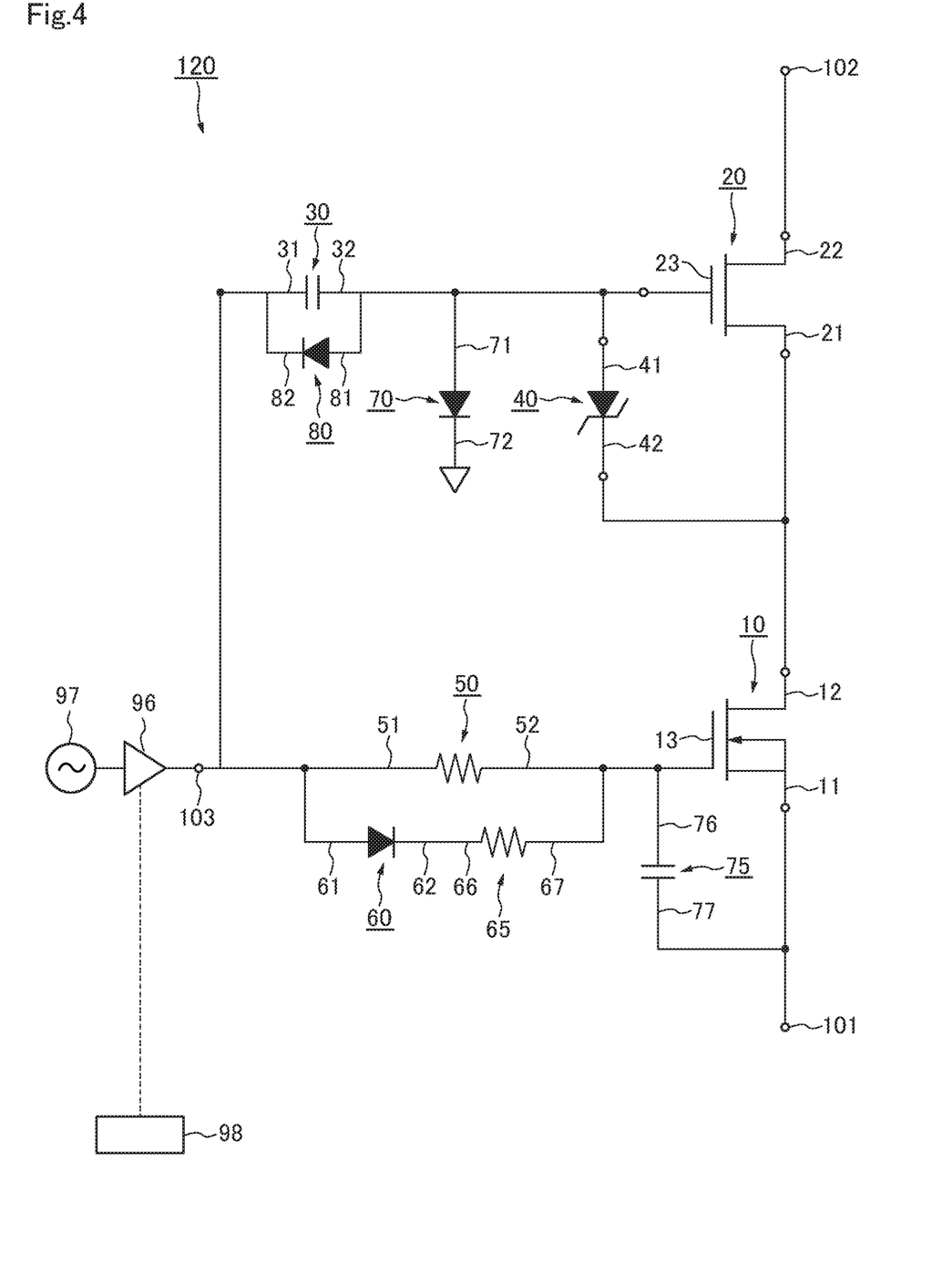
FIG. 4 is a circuit diagram of a semiconductor device according to a second other aspect of the embodiment.

FIG. 4 is a circuit diagram of the semiconductor device 120 according to the second other aspect of the embodiment.

In the semiconductor device 120, the control circuit 98 is connected to the semiconductor device 110. The control circuit 98 is, for example, an electronic circuit. The control circuit 98 is, for example, a computer configured with a combination of hardware such as an arithmetic circuit and software such as a program. The control circuit 98 is an IC in which a plurality of elements are integrated into a single chip or an electronic circuit board on which a plurality of electronic components are disposed.

Figure 5A:
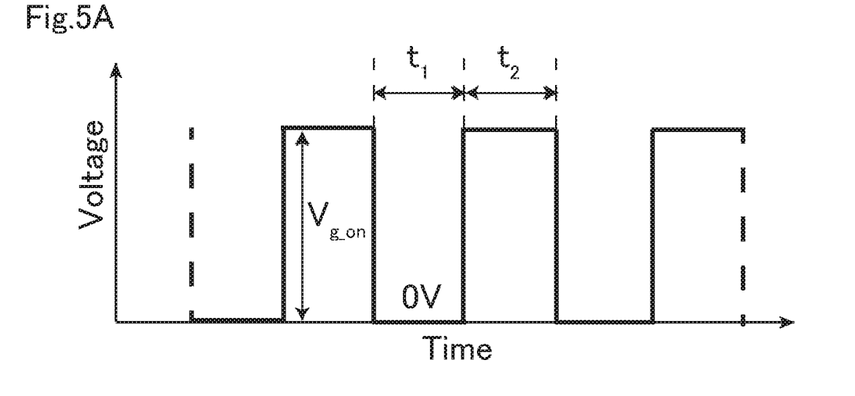
FIGS. 5A to 5C are schematic diagrams illustrating examples of $V_{g\_on}$.
Figure 5B:
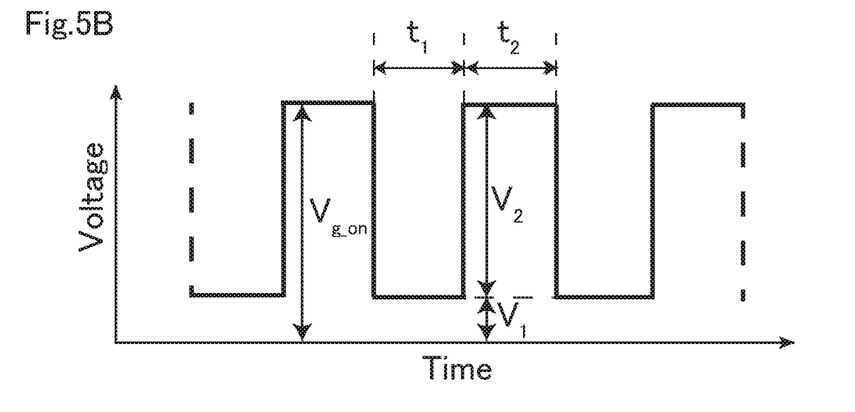
Figure 5C:
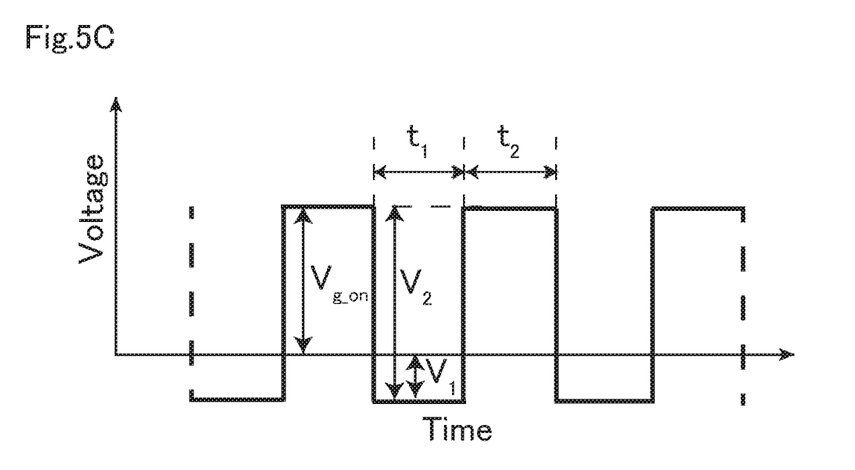

FIGS. 5A to 5C are schematic diagrams illustrating examples of the voltages generated by the gate drive circuit. FIG. 5A illustrates a case where the voltage to be input to the third terminal 103 is a square wave in which 0 V output during the time $t_1$ and $V_{g\_on}$ output during the time $t_2$ are repeated. FIG. 5B illustrates a case where the voltage to be input to the third terminal 103 is a square wave in which $V_1$ output during the time $t_1$ and the sum of $V_1$ and $V_2$ output during the time $t_2$ are repeated. In the case of FIG. 5B, $V_{g\_on} = V_1 + V_2$ ($V_{g\_on} = |V_1| + |V_2|$). FIG. 5C illustrates a case where a negative voltage is output during time $t_1$. In the case of FIG. 5C, $V_{g\_on} = |V_2| - |V_1|$. Thus, the voltage to be input to the third terminal 103 is a voltage that changes with time. Then, for example, the maximum voltage to be input to the third terminal 103 is $V_{g\_on}$. In addition, in FIGS. 5A to 5C, illustration is made as $t_1 = t_2$, but $t_1$ and $t_2$ may be different. In addition, the voltage to be input to the third terminal 103 is not limited to that illustrated in FIGS. 5A to 5C. Moreover, the measurement of $V_{g\_on}$ can be easily performed by using a commercially available oscilloscope or the like.

The voltage to be input to the third terminal 103 illustrated in FIGS. 5A to 5C is generated by using, for example, the signal source 97 and the gate drive circuit 96 illustrated in FIGS. 3 and 4. In addition, the voltage to be input to the third terminal 103 may be generated by using other known electric circuits or the like. Then, the voltage to be input to the third terminal 103 illustrated in FIGS. 5A to 5C is input to the first end 31, the third end 51, the second anode 61, and the fourth cathode 82.

The voltage output during the time $t_1$ is an example of a low level voltage. The voltage output during the time $t_2$ is an example of a high level voltage.

Next, operations of the semiconductor device 100, the semiconductor device 110, and the semiconductor device 120 according to the embodiments will be described.

By using the signal source 97 and the gate drive circuit 96 illustrated in, for example, FIGS. 3 and 4, a square wave reciprocating between 0 V and $V_{g\_on}$ as illustrated in FIG. 5A is output.

Figure 6A:
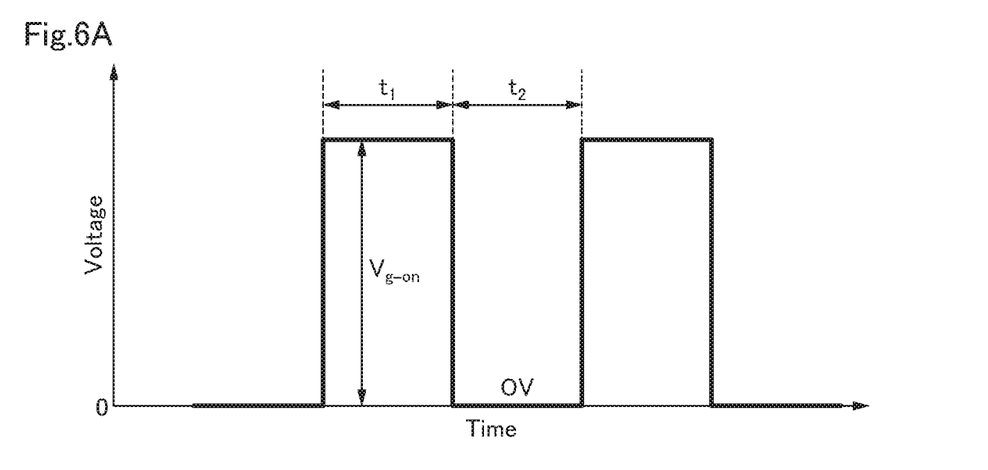
FIGS. 6A and 6B are schematic diagrams illustrating examples of $V_{g\_on}$ and examples of a voltage to be input to a second control electrode.
Figure 6B:
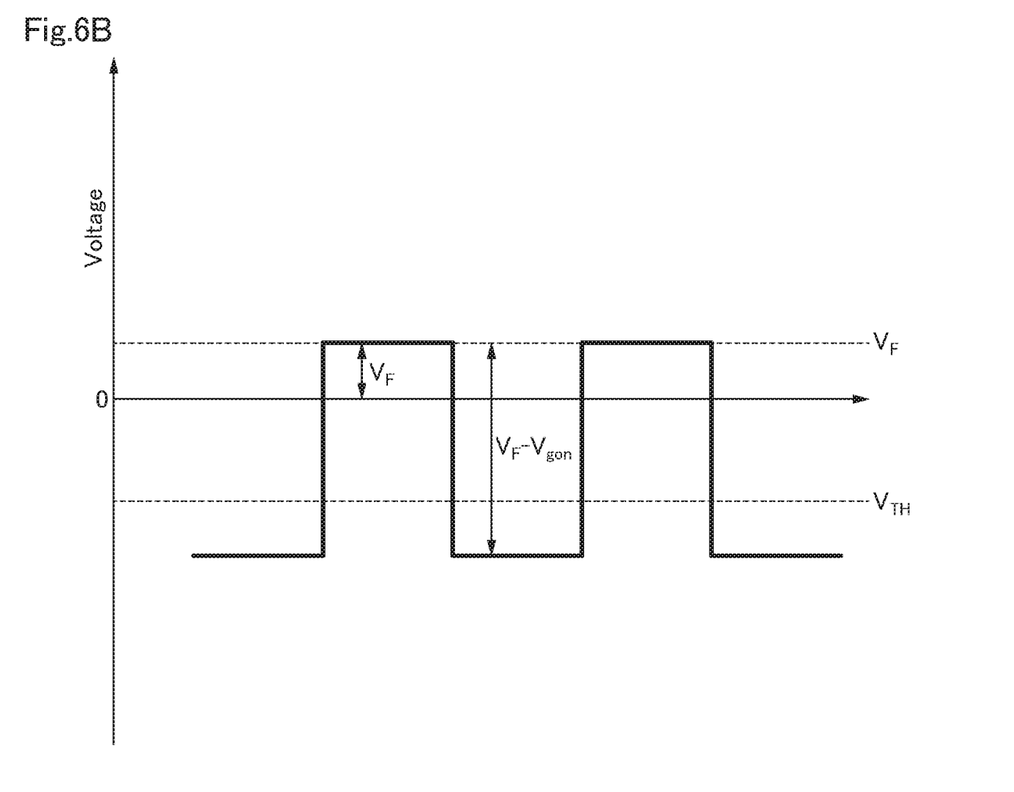

FIGS. 6A and 6B are schematic diagrams illustrating an example of the voltage generated by the gate drive circuit and an example of the voltage to be input to the second control electrode 23. FIG. 6A illustrates a case where the output voltage of the gate drive circuit 96 is a square wave in which 0 V output during the time $t_1$ and $V_{g\_on}$ output during the time $t_2$ are repeated. FIG. 6B is an example of the voltage to be input to the second control electrode 23 in a case where the voltage illustrated in FIG. 6A is input to the third terminal 103.

When $V_{g\_on}$ is input to the third terminal 103, a current flows from the first capacitor 30 via the second diode 70. A voltage corresponding to a forward voltage $V_F$ of the second diode 70 is input between the second control electrode 23 and the third electrode 21. Therefore, the normally-on transistor 20 is turned on. On the other hand, when 0 V is input to the third terminal 103, a current flows to the first capacitor 30 via the gate-source capacitance of the normally-on transistor 20. A negative voltage ($V_F$–$V_{g\_on}$) corresponding to the difference between $V_F$ and $V_{g\_on}$ is input between the second control electrode 23 and the third electrode 21. Therefore, the normally-on transistor 20 can be turned off.

When $V_{g\_on}$ is output to the third terminal 103, if the $V_{g\_on}$ is higher than a gate threshold voltage $V_{th}$ of the normally-off transistor 10, the normally-off transistor is turned on.

Herein, it is preferable that the normally-off transistor 10 be turned on earlier than the normally-on transistor 20 when the semiconductor device shifts from the OFF state to the ON state. When the normally-on transistor 20 is turned on first, a high voltage is applied to a connection portion between the second electrode 12 and the third electrode 21, and thus, this is because there is a concern that the characteristics of the normally-off transistor 10 having a low breakdown voltage are deteriorated.

In the semiconductor device 100 according to the embodiment, when the semiconductor device shifts from the OFF state to the ON state, the current output from the gate drive circuit 96 flows through the first diode 60. For this reason, the charging of the first control electrode 13 is not affected by the first resistor 50. Therefore, the first control electrode 13 can be charged quickly. Accordingly, when the semiconductor device shifts from the OFF state to the ON state, the normally-off transistor 10 can be reliably turned on earlier than the normally-on transistor 20.

Further, by providing the first resistor 50, the OFF timing of the normally-off transistor 10 can be delayed from the OFF timing of the normally-on transistor 20 by a desired time. Furthermore, by a proper combination of the first diode 60, the first resistor 50, and the second resistor 65, in a case where 0 V is input to the third terminal 103, it is possible to allow the normally-off transistor 10 to be kept turned on.

In addition, the case where 0 V is output by the signal source 97 and the to drive circuit 96, and both the normally-off transistor 10 and the normally-on transistor 20 are turned off is considered. When a high voltage is applied to the fourth electrode 22, the voltage of the third electrode 21 increases. At this time, there is a concern that the OFF state of the normally-on transistor 20 is not be maintained. For this reason, the third diode 80 is provided to short-circuit the gate drive circuit 96 and the second control electrode 23, so that the OFF state of the normally-on transistor 20 is maintained.

When the time when the high level voltage is input to the first end 31, the third end 51, the second anode 61 and the eighth cathode 82 is denoted by the high level voltage is denoted by $V_{g\_on}$, and the gate threshold voltage of the normally-off transistor 10 is denoted by $V_{th}$, the resistance value of the second resistor 65 is denoted by $R_2$, and the electrostatic capacitance of the second capacitor 75 is denoted by $C_2$, $$V_{g\_on}\{1-e^{-t1/R_2C_2}\}<V_{th} \qquad \text{[Mathematical Formula 2]}$$

it is preferable that Mathematical Formula 2 is satisfied.

In addition, when the time when the high level voltage is input to the first end 31, the third end 51, the second anode 61 and the eighth cathode 82 is denoted by $t_1$, the resistance value of the first resistor 50 is denoted by $R_1$, the parasitic capacitance of the normally-off transistor 10 is denoted by $C_{iss}$, the high level voltage is denoted by $V_{g\_on}$, the gate threshold voltage of the normally-off transistor 10 is denoted by $V_{th}$, the resistance value of the second resistor is denoted by $R_2$, and the electrostatic capacitance of the second capacitor is denoted by $C_2$, $$V_{g\_on}\{1-e^{-t1/(R_1R_2/(R_1+R_2))(C_2+C_{iss}))}\}<V_{th} \qquad \text{[Mathematical Formula 3]}$$

it is preferable that Mathematical Formula 3 is satisfied.

In addition, the parasitic capacitance $C_{iss}$ of the normally-off transistor 10 is the sum of the gate-source capacitance $C_{gs}$, of the normally-off transistor 10 and the gate-drain capacitance $C_{gd}$ of the normally-off transistor 10.

It is preferable that, when the electrostatic capacitance of the second capacitor 75 is denoted by $C_2$ and the resistance value of the second resistor 65 is denoted by $R_2$, $$R_2C_2 \qquad \text{[Mathematical Formula 4]}$$

the control circuit 98 operates the semiconductor device 120 on the basis of the above Mathematical Formula 4.

In addition, it is preferable that, when the resistance value of the first resistor 50 is denoted by $R_1$, the resistance value of the second resistor 65 is denoted by $R_2$, the electrostatic capacitance of the second capacitor 75 is denoted by $C_2$ and the parasitic capacitance of the normally-off transistor 10 is denoted by $C_{iss}$, $$\{R_1R_2/(R_1+R_2)\}(C_2+C_{iss}) \qquad \text{[Mathematical Formula 5]}$$

the control circuit 98 operates the semiconductor device 120 on the basis of the above Mathematical Formula 5.

The functions and effects of the semiconductor device 100, the semiconductor device 110, and the semiconductor device 120 according to the embodiments will be collectively described below.

Figure 7A:
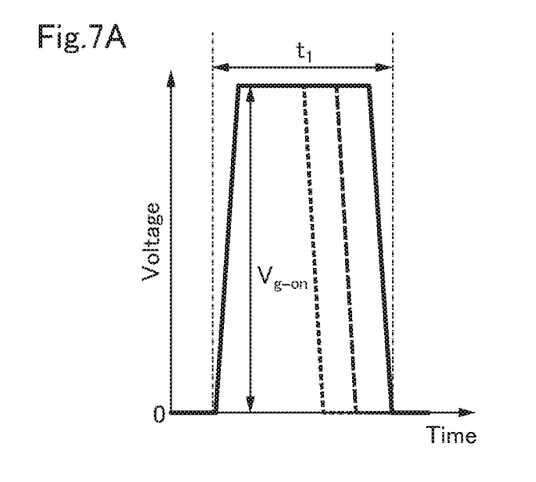
FIGS. 7A to 7C are schematic diagrams illustrating examples of a voltage of a first end and a voltage to be input to a second control electrode in a semiconductor device according to Comparative Example.
Figure 7B:
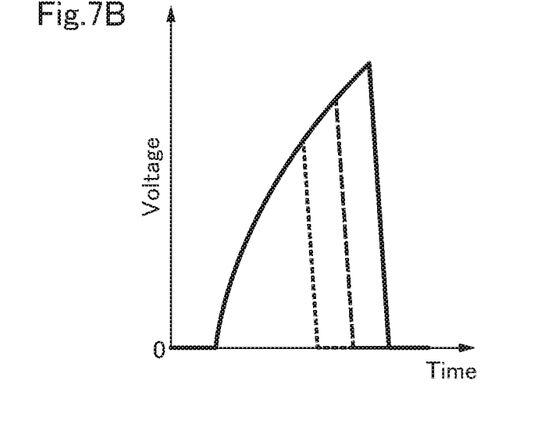
Figure 7C:
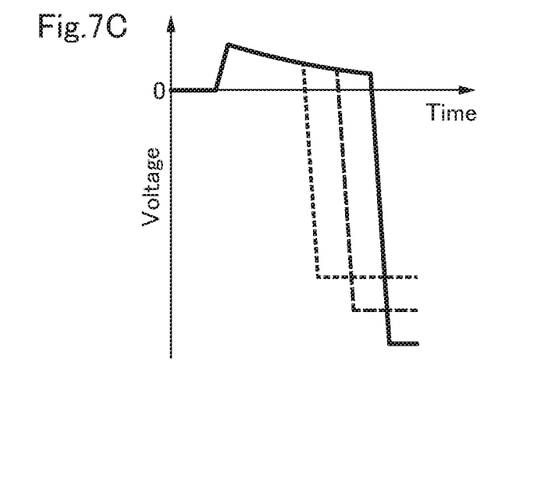

FIGS. 7A to 7C are schematic diagrams illustrating examples of the voltages of the first end 31 and the voltages to be input to the second control electrode 23 in the semiconductor device according to Comparative Example. FIG. 7A illustrates examples of the voltages output from the signal source 97 and the gate drive circuit 96. FIG. 7B is a schematic diagram illustrating examples of the voltages to be input to the first end 31 in the semiconductor device according to Comparative Example. FIG. 7C is a schematic diagram illustrating examples of the voltages to be input to the second control electrode 23 in the semiconductor device according to Comparative Example. In addition, the waveforms illustrated in FIG. 7A are merely examples and does not match the waveforms illustrated in, for example, FIGS. 5A to 5C, 6A and 6B, and 8A and 8B.

For example, the case where only one pulse of $V_{g\_on}$ having a short, pulse width is output by using the signal source 97 and the gate drive circuit 96 is considered. In this case, as illustrated in FIGS. 7A and 7B, the voltage to be input to the first end 31 becomes low as compared with the voltage $V_{g\_on}$ output from the gate drive circuit 96. This is because the pulse width is too short and, thus, sufficient charges are not accumulated in the first capacitor 30. Then, in this case, as illustrated in FIG. 7C, the voltage to be input to the second control electrode 23 is charged by the electric charges accumulated in the first capacitor 30 within the time $t_1$. The amount of charges accumulated in the first capacitor 30 is preferably larger than the amount of charges required to sufficiently close the channel of the normally-on transistor 20. For this reason, there is a problem that the normally-on transistor 20 is not turned off in a case where only one pulse of $V_{g\_on}$ having a short pulse width is output.

Therefore, the semiconductor device 100, the semiconductor device 110, and the semiconductor device 120 according to the embodiments include the second resistor 65 and the second capacitor 75.

If the normally-off transistor 10 can be kept turned off in a case where $V_{g\_on}$ having a short pulse width is output, the normally-on transistor 20 can be kept turned off. This point will be described below. In a case where the normally-off transistor 10 is in the OFF state, the potential of the third electrode 21 can be increased up to, for example, the voltage $V_{DD}$ of an external power source provided outside the semiconductor device 100, the semiconductor device 110, and the semiconductor device 120. When the potential of the third electrode 21 is increased up, the difference between the voltage of the second control electrode 23 and the voltage of the third electrode 21 can be a large negative voltage. For this reason, the normally-on transistor 20 can be turned off.

The second resistor 65 and the second capacitor 75 function as an RC circuit connected to the normally-off transistor 10. Therefore, since the charging of the charges to the first control electrode 13 is delayed, in a case where only one pulse of $V_{g\_on}$ having a short pulse width is output, the normally-off transistor 10 can be kept turned off. As a result, in a case where only one pulse of $V_{g\_on}$ having a short pulse width is output, the normally-on transistor 20 can be kept turned off.

When the electrostatic capacitance of the second capacitor 75 is denoted by $C_2$, the gate-source capacitance of the normally-off transistor 10 is denoted by $C_{gs}$, and the gate-drain capacitance of the normally-off transistor 10 is denoted by $C_{gd}$, it is preferable that Mathematical Formula 1 is satisfied. This is because the electrostatic capacitance $C_2$ of the second capacitor 75 is set to be sufficiently large and, thus, the normally-off transistor 10 is kept turned off.

Figure 8A:
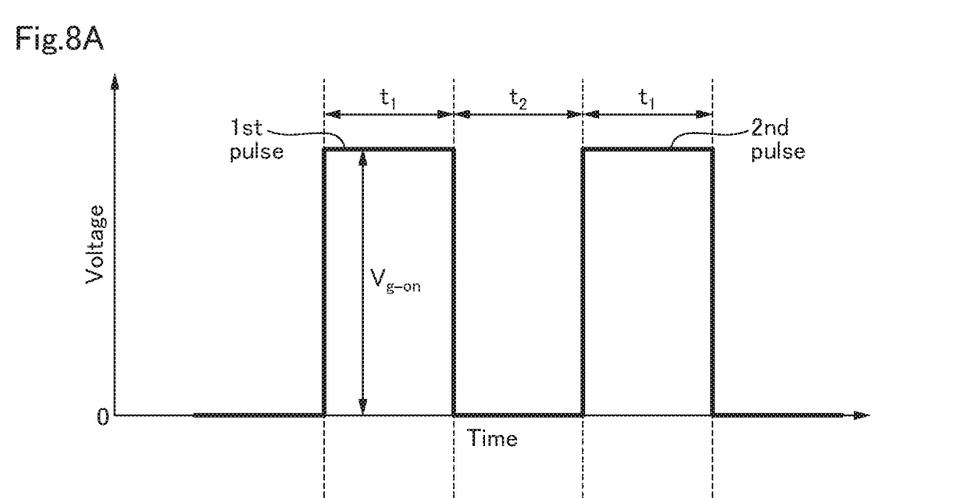
FIGS. 8A and 8B, are schematic diagrams illustrating examples of a voltage to be input to a first control electrode in the semiconductor device according to the embodiment.
Figure 8B:
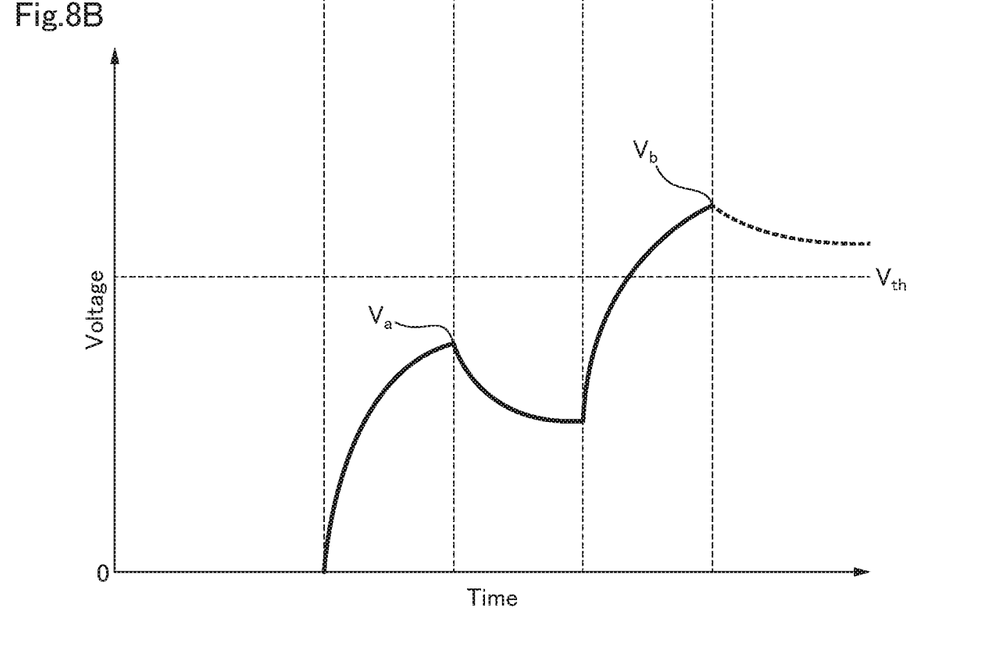

FIGS. 8A and 8B are schematic diagrams illustrating examples of the voltage to be input to the first control electrode 13 in the semiconductor device 100, the semiconductor device 110, and the semiconductor device 120 according to the embodiments. FIG. 8A illustrates a case where the output voltage of the gate drive circuit 96 is a square wave in which 0 V output during the time $t_1$ and $V_{g\_on}$ output during the time $t_2$ are repeated. FIG. 8B is a schematic diagram illustrating an example of the voltage to be input to the first control electrode 13 in a case where the voltage illustrated in FIG. 8A is input to the third terminal 103.

As described above, in the semiconductor device 100, the semiconductor device 110, and the semiconductor device 120 according to the embodiments, it is considered that the normally-off transistor 10 is connected to the RC circuit. For this reason, as illustrated in FIG. 8B, when the 1st Pulse is applied, the voltage to be input to the first control electrode 13 is increased with the passage of time and becomes $V_a$. When the 1st Pulse is no longer applied, the voltage to be input to the first control electrode 13 is decreased with the passage of time. When the 2nd Pulse is applied, the voltage to be input to the first control electrode 13 is increased with the passage of time and becomes $V_b$.

In order not to turn on the normally-off transistor 10 by the 1st. Pulse, $V_a$ is preferably lower than the gate threshold voltage $V_{th}$ of the normally-off transistor 10. In consideration of the charge and discharge characteristics of the RC circuit, when the high level voltage is denoted by $V_{g\_on}$ the gate threshold voltage of the normally-off transistor is denoted by $V_{th}$, the resistance value of the second resistor is denoted by $R_2$, the electrostatic capacitance of the second capacitor is denoted by $C_2$, and the time when the high level voltage is input is denoted by $t_1$, it is preferable the Mathematical Formula 2 is satisfied.

In addition, in the RC circuit connected to the normally-off transistor 10, it is considered that the resistor R is a combined circuit of the first resistor 50 and the second resistor 65, and the capacitance C is a combined capacitance of the parasitic capacitance $C_{iss}$ of the normally-off transistor 10 and the electrostatic capacitance $C_2$ of the second capacitor 75. Therefore, it is preferable that Mathematical Formula 3 is satisfied. Any one of Mathematical Formula 2 and Mathematical Formula 3 mentioned above can be preferably used.

In addition, it is preferable that the control circuit 98 operates the semiconductor device 120 on the basis of Mathematical Formula 4 or Mathematical Formula 5. These Mathematical Formulas are used in the exponential functions of Mathematical Formulas 2 and 3. Specifically, in order to turn off the normally-off transistor 10, it is preferable that Mathematical Formula 3 or Mathematical Formula 4 mentioned above are as large as possible according to the time $t_1$ when the high level voltage is input. In addition, it is preferable that the control circuit 98 measures the resistance value $R_1$ of the first resistor 50, the resistance value $R_2$ of the second resistor 65, and the electrostatic capacitance $C_2$ of the second capacitor 75 using a known measuring machine, calculates Mathematical Formula 3 or Mathematical Formula 4, and controls the high level voltage $V_{g\_on}$ so as to satisfy Mathematical Formula 2 or Mathematical Formula 3. In addition, the above-mentioned known measuring machine may be incorporated in, for example, the control circuit 98.

The Zener voltage Vz of the Zener diode 40 is preferably lower than the breakdown voltage of the normally-on transistor 20 between the second control electrode 23 and the third electrode 21. The Zener diode 40 functions as a safety device for the normally-on transistor 20, and this is because it is preferable that the Zener diode 40 conducts at a voltage lower than the breakdown voltage of the normally on transistor 20 between the second control electrode 23 and the third electrode 21.

The electrostatic capacitance $C_1$ of the first capacitor 30 is preferably 10 times or more the input capacitance of the normally-on transistor 20. This is because, when the electrostatic capacitance $C_1$ of the first capacitor 30 is smaller than 10 times the input capacitance of the normally-on transistor 20, the voltage input to the third terminal 103 is not sufficiently input to the second control electrode 23.

While certain embodiments have been described, these embodiments have been presented by way of example only, and are not intended to limit the scope of the inventions. Indeed, semiconductor devices described herein may be embodied in a variety of other forms; further more, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a normally-off transistor having a first electrode, a second electrode, and a first control electrode;
   a normally-on transistor having a third electrode electrically connected to the second electrode, a fourth electrode, and a second control electrode;
   a first capacitor having a first end and a second end electrically connected to the second control electrode;
   a Zener diode having a first anode and a first cathode, the first anode being electrically connected to the second end and the second control electrode, and the first cathode being electrically connected to the third electrode;

a first resistor having a third end and a fourth end electrically connected to the first control electrode;

a first diode having a second anode and a second cathode, the second anode being electrically connected to the third end;

a second resistor having a fifth end electrically connected to the second cathode and a sixth end electrically connected to the fourth end and the first control electrode;

a second diode having a third anode and a third cathode, the third anode being electrically connected to the second end, the first anode, and the second control electrode, and the third cathode being electrically connected to the first electrode; and a second capacitor having a seventh end and an eighth end, the seventh end being electrically connected to the fourth end, the sixth end, and the first control electrode, and the eighth end being electrically connected to the first electrode, wherein the first capacitor is a ceramic capacitor.

2. The device according to claim 1, further comprising a gate drive circuit connected to the first end, the third end, and the second anode.

3. The device according to claim 2, wherein a signal having a high level voltage and a low level voltage is output by using the gate drive circuit, and wherein, when the high level voltage is denoted by $V_{g\_on}$, a gate threshold voltage of the normally-off transistor is denoted by $V_{th}$, a resistance value of the second resistor is denoted by $R_2$, an electrostatic capacitance of the second capacitor is denoted by $C_2$, and a time of inputting the high level voltage by using the gate drive circuit is denoted by $t_1$, Mathematical Formula 1 is satisfied.

$$V_{g\_on}\{1-e^{-t1/R_2C_2}\}<V_{th} \quad \text{[Mathematical Formula 1]}$$

4. The device according to claim 2, wherein a signal having a high level voltage and a low level voltage is output by using the gate drive circuit, and wherein, when a resistance value of the first resistor is denoted by $R_1$, a parasitic capacitance of the normally-off transistor is denoted by $C_{iss}$, the high level voltage is denoted by $V_{g\_on}$, a gate threshold voltage of the normally-off transistor is denoted by $V_{th}$, a resistance value of the second resistor is denoted by $R_2$, an electrostatic capacitance of the second capacitor is denoted by $C_2$, and a time of outputting the high level voltage by using the gate drive circuit is denoted by $t_1$, Mathematical Formula 2 is satisfied.

$$V_{g\_on}\{1-e^{-t1/[(R_1R_2/(R_1+R_2))(C_2+C_{iss})]}\}<V_{th} \quad \text{[Mathematical Formula 2]}$$

5. The device according to claim 1, further comprising a control circuit operating the semiconductor device on the basis of Mathematical Formula 3, when an electrostatic capacitance of the second capacitor is denoted by $C_2$ and a resistance value of the second resistor is denoted by $R_2$.

$$R_2C_2 \quad \text{[Mathematical Formula 3]}$$

6. The device according to claim 1, further comprising a control circuit operating the semiconductor device on the basis of Mathematical Formula 4, when a resistance value of the first resistor is denoted by $R_1$, a resistance value of the second resistor is denoted by $R_2$, an electrostatic capacitance of the second capacitor is denoted by $C_2$, and a parasitic capacitance of the normally-off transistor is denoted by $C_{iss}$.

$$\{R_1R_2/(R_1+R_2)\}(C_2+C_{iss}) \quad \text{[Mathematical Formula 4]}$$

7. The device according to claim 1, wherein, when an electrostatic capacitance of the second capacitor is denoted by $C_2$, a gate-source capacitance of the normally-off transistor is denoted by $C_{gs}$, and a gate-drain capacitance of the normally-off transistor is denoted by $C_{gd}$, Mathematical Formula 5 is satisfied.

$$C_2 > C_{gs} + C_{gd} \quad \text{[Mathematical Formula 5]}$$

8. The device according to claim 1, wherein an electrostatic capacitance $C_1$ of the first capacitor is 10 times or more an input capacitance of the normally-on transistor.

9. The device according to claim 1, further comprising a third diode having a fourth anode electrically connected to the second end and a fourth cathode electrically connected to the first end.

10. The device according to claim 1, wherein the first diode is a Schottky barrier diode.

11. The device according to claim 1, wherein the second diode is a Schottky barrier diode.

12. The device according to claim 1, further comprising a third diode having a fourth anode electrically connected to the second end and a fourth cathode electrically connected to the first end.

13. The device according to claim 12, wherein the third diode is a Schottky barrier diode.

14. The device according to claim 2, further comprising a signal source connected to the gate drive circuit.

15. A semiconductor device comprising:

a normally-off transistor having a first electrode, a second electrode, and a first control electrode;

a normally-on transistor having a third electrode electrically connected to the second electrode, a fourth electrode, and a second control electrode;

a first capacitor having a first end and a second end electrically connected to the second control electrode;

a Zener diode having a first anode and a first cathode, the first anode being electrically connected to the second end and the second control electrode, and the first cathode being electrically connected to the third electrode;

a first resistor having a third end and a fourth end electrically connected to the first control electrode;

a first diode having a second anode and a second cathode, the second anode being electrically connected to the third end;

a second resistor having a fifth end electrically connected to the second cathode and a sixth end electrically connected to the fourth end and the first control electrode;

a second diode having a third anode and a third cathode, the third anode being electrically connected to the second end, the first anode, and the second control electrode, and the third cathode being electrically connected to the first electrode; and a second capacitor having a seventh end and an eighth end, the seventh end being electrically connected to the fourth end, the sixth end, and the first control electrode, and the eighth end being electrically connected to the first electrode, wherein a Zener voltage Vz of the Zener diode is lower than a breakdown voltage of the normally-on transistor between the second control electrode and the third electrode.

16. The device according to claim 15, further comprising a gate drive circuit connected to the first end, the third end, and the second anode.

17. The device according to claim 16,
wherein a signal having a high level voltage and a low level voltage is output by using the gate drive circuit, and
wherein, when the high level voltage is denoted by $V_{g\_on}$, a gate threshold voltage of the normally-off transistor is denoted by $V_{th}$, a resistance value of the second resistor is denoted by $R_2$, an electrostatic capacitance of the second capacitor is denoted by $C_2$, and a time of inputting the high level voltage by using the gate drive circuit is denoted by $t_1$, Mathematical Formula 1 is satisfied.

$$V_{g\_on}\{1-e^{-t_1/R_2 C_2}\} < V_{th} \qquad \text{[Mathematical Formula 1]}$$

18. The device according to claim 16,
wherein a signal having a high level voltage and a low level voltage is output by using the gate drive circuit, and
wherein, when a resistance value of the first resistor is denoted by $R_1$, a parasitic capacitance of the normally-off transistor is denoted by $C_{iss}$, the high level voltage is denoted by $V_{g\_on}$, a gate threshold voltage of the normally-off transistor is denoted by $V_{th}$, a resistance value of the second resistor is denoted by $R_2$, an electrostatic capacitance of the second capacitor is denoted by $C_2$, and a time of outputting the high level voltage by using the gate drive circuit is denoted by $t_1$, Mathematical Formula 2 is satisfied.

$$V_{g\_on}\{1-e^{-t_1/[(R_1 R_2/(R_1+R_2))(C_2+C_{iss})]}\} < V_{th} \qquad \text{[Mathematical Formula 2]}$$

19. The device according to claim 15, further comprising a control circuit operating the semiconductor device on the basis of Mathematical Formula 3, when an electrostatic capacitance of the second capacitor is denoted by $C_2$ and a resistance value of the second resistor is denoted by $R_2$.

$$R_2 C_2 \qquad \text{[Mathematical Formula 3]}$$

20. The device according to claim 15, further comprising a control circuit operating the semiconductor device on the basis of Mathematical Formula 4, when a resistance value of the first resistor is denoted by $R_1$, a resistance value of the second resistor is denoted by $R_2$, an electrostatic capacitance of the second capacitor is denoted by $C_2$, and a parasitic capacitance of the normally-off transistor is denoted by $C_{iss}$.

$$\{R_1 R_2/(R_1+R_2)\}(C_2+C_{iss}) \qquad \text{[Mathematical Formula 4]}$$

21. A semiconductor device comprising:
a normally-off transistor having a first electrode, a second electrode, and a first control electrode;
a normally-on transistor having a third electrode electrically connected to the second electrode, a fourth electrode, and a second control electrode;
a first capacitor having a first end and a second end electrically connected to the second control electrode;
a Zener diode having a first anode and a first cathode, the first anode being electrically connected to the second end and the second control electrode, and the first cathode being electrically connected to the third electrode;
a first resistor having a third end and a fourth end electrically connected to the first control electrode;
a first diode having a second anode and a second cathode, the second anode being electrically connected to the third end;
a second resistor having a fifth end electrically connected to the second cathode and a sixth end electrically connected to the fourth end and the first control electrode;
a second diode having a third anode and a third cathode, the third anode being electrically connected to the second end, the first anode, and the second control electrode, and the third cathode being electrically connected to the first electrode; and
a second capacitor having a seventh end and an eighth end, the seventh end being electrically connected to the fourth end, the sixth end, and the first control electrode, and the eighth end being electrically connected to the first electrode,
wherein the second capacitor is a ceramic capacitor.

* * * * *